(12) United States Patent
Cho et al.

(10) Patent No.: US 12,080,814 B2
(45) Date of Patent: Sep. 3, 2024

(54) PHOTORECEPTOR, PANEL, AND METHOD FOR MANUFACTURING PHOTORECEPTOR

(71) Applicant: HKC CORPORATION LIMITED, Shenzhen (CN)

(72) Inventors: En-Tsung Cho, Chongqing (CN); Fengyun Yang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 558 days.

(21) Appl. No.: 17/297,475

(22) PCT Filed: Dec. 4, 2019

(86) PCT No.: PCT/CN2019/122896
§ 371 (c)(1),
(2) Date: May 27, 2021

(87) PCT Pub. No.: WO2020/119537
PCT Pub. Date: Jun. 18, 2020

(65) Prior Publication Data
US 2022/0037539 A1    Feb. 3, 2022

(30) Foreign Application Priority Data

Dec. 11, 2018 (CN) .......................... 201811510595.X

(51) Int. Cl.
*H01L 31/028* (2006.01)
*H01L 31/0328* (2006.01)
*H01L 31/18* (2006.01)

(52) U.S. Cl.
CPC ........ *H01L 31/028* (2013.01); *H01L 31/0328* (2013.01); *H01L 31/1804* (2013.01); *H01L 31/1812* (2013.01)

(58) Field of Classification Search
CPC ............... H01L 31/028; H01L 31/0328; H01L 31/1804; H01L 31/1812; H01L 31/035281;
(Continued)

(56) References Cited

U.S. PATENT DOCUMENTS 9,151,853 B2    10/2015   Dahal et al.
9,595,628 B1    3/2017    Okandan et al.
(Continued)

FOREIGN PATENT DOCUMENTS

CN    1423112 A      6/2003
CN    101379222 A    3/2009
(Continued)

OTHER PUBLICATIONS

Chunying Chai, the ISA written comments, Mar. 2020, CN.
Chunying Chai, the International Search Report, Mar. 2020, CN.

*Primary Examiner* — Karen Kusumakar
*Assistant Examiner* — Shawn Shaw Muslim

(57) ABSTRACT

This application discloses a photoreceptor, a panel, and a method for manufacturing a photoreceptor. The photoreceptor includes a photosensitive layer. The photosensitive layer includes a subject entity including a plurality of holes, and an object entity including at least two photosensitive materials whose photosensitive wavelength bands are different. The holes of the subject entity are filled with the photosensitive materials.

16 Claims, 5 Drawing Sheets

(58) Field of Classification Search
CPC ...... H01L 31/09; H01L 31/1013; Y02P 70/50; G01J 1/42
See application file for complete search history.

(56) References Cited

U.S. PATENT DOCUMENTS

| | | | |
|---|---|---|---|
| 9,869,584 | B1 | 1/2018 | Evans et al. |
| 10,409,053 | B1* | 9/2019 | Kumar ............... H01L 29/66742 |
| 2009/0014764 | A1* | 1/2009 | Coudrain .......... H01L 27/14689 |
| | | | 438/93 |
| 2019/0051686 | A1* | 2/2019 | Azami .................. H04N 25/70 |
| 2019/0319049 | A1* | 10/2019 | Bert .................... H01L 27/1218 |

FOREIGN PATENT DOCUMENTS

| | | |
|---|---|---|
| CN | 104425529 A | 3/2015 |
| CN | 106708326 A | 5/2017 |
| CN | 207183287 U | 4/2018 |
| CN | 109755332 A | 5/2019 |

\* cited by examiner

PHOTORECEPTOR, PANEL, AND METHOD FOR MANUFACTURING PHOTORECEPTOR

CROSS-REFERENCE TO RELATED APPLICATIONS

This application claims priority to Chinese Patent Application No. CN 201811510595.X filed with the National Intellectual Property Administration, PRC on Dec. 11, 2018 and entitled "PHOTORECEPTOR, PANEL, AND METHOD FOR MANUFACTURING PHOTORECEPTOR", which is incorporated herein by reference in its entirety.

TECHNICAL FIELD

This application relates to the field of display technology, and in particular, to a photoreceptor, a panel, and a method for manufacturing a photoreceptor.

BACKGROUND

The description in the background section merely provides background information related to this application, but does not necessarily constitute related art.

A photoreceptor is primarily designed to sense light. A photosensitive material is disposed in the photoreceptor. After being irradiated by external light, the photoreceptor generates an induced voltage corresponding to a light intensity. Development of display technology, especially popularization of smart phones, enables the photoreceptor to be further integrated in a display panel of a television set or a mobile phone, for example. The photoreceptor is controlled based on an active switch, reads light intensity in a corresponding position, and is applicable to applications such as touch control and fingerprint detection.

However, an existing photoreceptor, especially a photoreceptor in the field of display panels, is vulnerable to insufficient photosensitivity, insufficient adaptability, and delayed and slow response.

SUMMARY

An objective of this application is to provide a photoreceptor, a panel, and a method for manufacturing a photoreceptor, so that the photoreceptor is of higher adaptability and sensitivity.

This application discloses a photoreceptor. The photoreceptor includes a photosensitive layer. The photosensitive layer includes: a subject entity including a plurality of holes; and an object entity including at least two photosensitive materials whose photosensitive wavelength bands are different. The holes of the subject entity are filled with the photosensitive materials.

This application further discloses a panel, including: a plurality of the photoreceptors; a plurality of active switches; a plurality of gate lines connected to the plurality of active switches in a one-to-one correspondence; and a plurality of data lines intersecting the plurality of gate lines. An input terminal of the active switch is connected to an output terminal of the photoreceptor. A control terminal of the active switch is connected to a corresponding gate line. An output terminal of the active switch is connected to a corresponding data line. When the control terminal of the active switch is turned on, the output terminal of the active switch outputs an induced voltage of the photoreceptor to the data line of the panel.

This application further discloses a method for manufacturing a photoreceptor, including steps of:
forming a subject entity including a plurality of holes; and
filling the holes of the subject entity with an object entity;
where the object entity includes at least two photosensitive materials whose photosensitive wavelength bands are different.

This application senses light by using at least two photosensitive materials whose photosensitive wavelength bands are different, so that the photoreceptor can sense a wider range of photosensitive wavelength bands and is of higher adaptability and sensitivity. In addition, with at least two photosensitive materials, the mixing ratio of the two photosensitive materials whose photosensitive wavelength bands are different is adjustable. The range of the photosensitive wavelength band of the photosensitive materials varies with the mixing ratio of the photosensitive materials, thereby enabling the photoreceptor to be more adaptable to specific ambient light requirements when sensing light. The photosensitive materials are disposed in the holes, and the subject entity with the holes ensures stability of the photosensitive materials.

BRIEF DESCRIPTION OF DRAWINGS

The drawings outlined below constitute a part of the specification and are intended to enable a further understanding of the embodiments of this application, illustrate the embodiments of this application, and expound the principles of this application with reference to the text description. Apparently, the drawings outlined below are merely a part of embodiments of this application. A person of ordinary skill in the art may derive other drawings from the drawings without making any creative efforts. In the drawings.

DETAILED DESCRIPTION OF EMBODIMENTS

Figure 1:
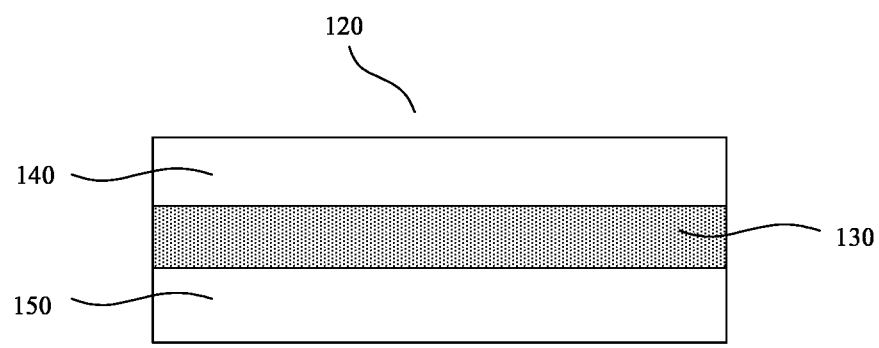
FIG. 1 is a schematic diagram of a photoreceptor according to an embodiment of this application.

It needs to be understood that the terms, specific structures, and function details disclosed herein are merely intended for describing specific embodiments and are representative. However, this application may be specifically implemented in many substitutional forms, but is not to be construed as being limited to the embodiments described herein.

In the context of this application, the terms "first" and "second" are used merely for descriptive purposes but are not to be construed as indicating relative importance or implicitly specifying the quantity of technical features indicated. Therefore, unless otherwise specified, a feature qualified by "first" or "second" may explicitly or implicitly include one such feature or a plurality of the features. A "plurality of" means two or more. The terms "include" and "comprise" and any variations thereof mean non-exclusive inclusion, and may indicate existence or addition of one or more other features, integers, steps, operations, units, components, and/or any combinations thereof.

In addition, the terms indicating a direction or a positional relationship, such as "center", "transverse", "upper", "lower", "left", "right", "vertical", "horizontal", "top", "bottom", "inner", and "outer", are a description based on the direction or relative positional relationship shown in the drawings, and are merely intended for ease or brevity of description of this application, but do not indicate that the indicated device or component must be located in the specified direction or constructed or operated in the specified direction. Therefore, such terms are not to be understood as a limitation on this application.

In addition, unless otherwise expressly specified and qualified, the terms "mount", "concatenate", and "connect" need to be understood in a broad sense, for example, understood as a fixed connection, a detachable connection, or an integrated connection; as a mechanical connection or an electrical connection; as a direct connection or an indirect connection implemented through an intermediary; or as interior communication between two components. A person of ordinary skill in the art can understand the specific meanings of the terms in this application according to the context.

The following describes this application in further detail with reference to drawings and optional embodiments.

Figure 2:
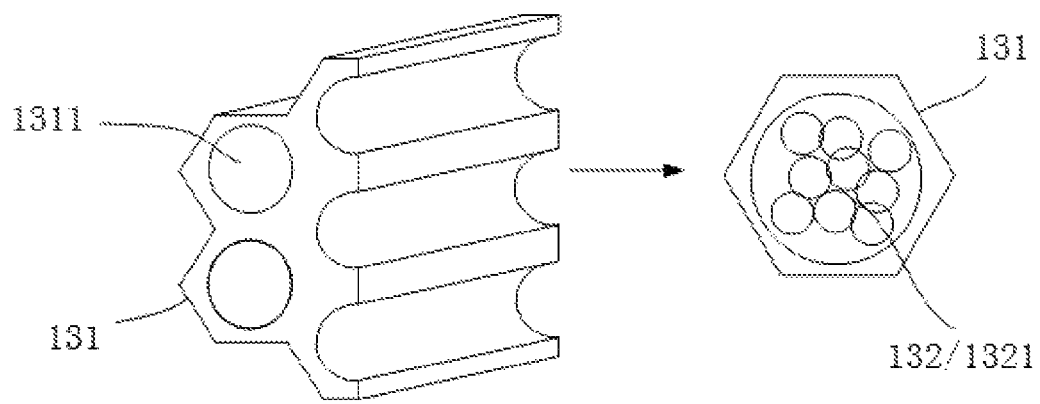
FIG. 2 is a schematic diagram of a photosensitive layer according to an embodiment of this application.
Figure 3:
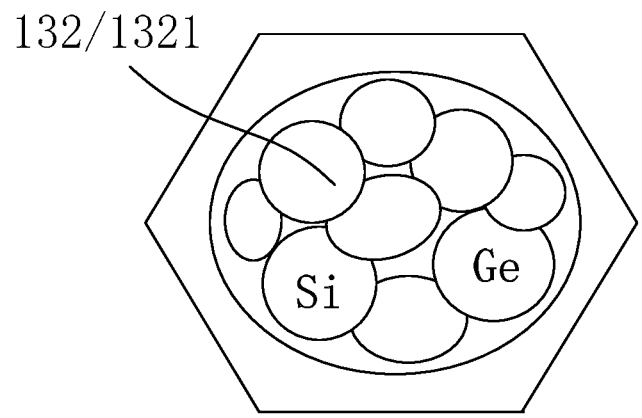
FIG. 3 is a schematic diagram of a photosensitive material according to an embodiment of this application.

As shown in FIG. 1 to FIG. 3, this application discloses a photoreceptor 120. The photoreceptor 120 includes a photosensitive layer 130. The photosensitive layer 130 includes a subject entity 131 including a plurality of holes 1311, and an object entity 132 including at least two photosensitive materials 1321 whose photosensitive wavelength bands are different. The holes 1311 of the subject entity 131 are filled with the photosensitive materials 1321.

In this solution, the photosensitive materials 1321 are disposed in the holes 1311. The subject entity 131 with the holes 1311 ensures stability of the photosensitive materials 1321. Light is sensed by using at least two photosensitive materials 1321 whose photosensitive wavelength bands are different. Therefore, in contrast with a photosensitive material 1321 that has only one fixed photosensitive wavelength band, the photoreceptor 120 in this application achieves a wider range of photosensitive wavelength bands, and is of higher adaptability and sensitivity. The subject entity 131 is mainly made of mesoporous silica. The silica is of high stability, and does not absorb light. This prevents the subject entity 131 from absorbing light, and therefore, the object entity 132 is not precluded from absorbing stronger light, and the sensitivity of the photoreceptor 120 is not thereby reduced. In addition, with at least two photosensitive materials 1321, the mixing ratio of the two photosensitive materials 1321 whose photosensitive wavelength bands are different is adjustable. The range of the photosensitive wavelength band of the photosensitive materials varies with the mixing ratio of the photosensitive materials 1321, thereby enabling the photoreceptor to be more adaptable to specific ambient light requirements when sensing light.

In one or more embodiments, the photoreceptor 120 further includes a first electrode 140 and a second electrode 150 that are disposed above and below the photosensitive layer respectively. One of the first electrode 140 and the second electrode 150 is a transparent electrode or both are transparent electrodes. In other words, the first electrode or the second electrode is a transparent electrode, or both the first electrode and the second electrode are transparent electrodes. In this solution, two electrodes are disposed above and below the photosensitive layer 130 respectively to form an induced electromotive force when light is incident on the photosensitive layer 130, generate an induced current moving into a circuit, adjust brightness of a display screen, and implement optical-to-electrical conversion. The photosensitive materials 1321 include, but are not limited to, a silicon (Si)-containing photosensitive material 1321 and a germanium (Ge)-containing photosensitive material 1321.

In this solution, the silicon-containing photosensitive material 1321 and the germanium-containing photosensitive material 1321 are selected to fill the holes 1311 of subject entity 131. The silicon-containing photosensitive material and the germanium-containing photosensitive material are generally more photosensitive than other photosensitive materials. In addition, the silicon-containing photosensitive material and the germanium-containing photosensitive material have different photosensitive wavelength bands, and differ sharply. For example, a band gap of monocrystalline silicon or nano silicon is approximately 1.12 eV, and mainly absorbs light whose wavelength is relatively short; and a band gap of monocrystalline germanium or nano germanium is approximately 0.67 eV, and mainly absorbs light whose wavelength is relatively long. A combination thereof can sense a wider range of light wavelengths.

In one or more embodiments, a molar weight (molar mass) of silicon in the silicon-containing photosensitive material 1321 is X, a molar amount (molar mass) of germanium in the germanium-containing photosensitive material 1321 is Y, the silicon-containing photosensitive material and the germanium-containing photosensitive material may be represented by $Si_xGe_y$, and X and Y satisfy the following formula: X:Y=1:(0.1~0.2). In this solution, the photosensitive materials 1321 mixed at different mixing ratios have different ranges of photosensitive wavelength bands, thereby being more adaptable to specific ambient light requirements pertinently. In $Si_xGe_y$, X:Y=1:(0.1~0.2), and silicon is a majority of the photosensitive materials. This mixing ratio is mainly intended for blue light. In addition, the photosensitive materials are doped with an appropriate proportion of germanium, silicon changes to non-monocrystalline silicon, and a band gap value increases to 1.7~2.7 eV. This enables absorption of purer blue light and quick reaction, and increases sensitivity. Further, if the molar weight of germanium exceeds 0.2, purity of the absorbed blue light will decrease, and the sensitivity of the photoreceptor designed for a special purpose of sensing blue light will decrease.

It is known that wavelengths of blue light are generally 476 nm~495 nm, wavelengths of green light are 495 nm~570 nm, and wavelengths of red light are 620 nm~750 nm. For green light whose wavelengths fall between the red light and the blue light, the mixing ratio of X to Y is adjusted to X:Y=1:(0.5~0.7). Silicon tends to absorb light whose wavelengths are relatively short, but germanium tends to absorb light whose wavelengths are relatively long. In an environment in which the ambient light is green light, silicon is a major part of the photosensitive materials. After the molar weight of germanium exceeds 0.7, the photosensitive materials tend to absorb the green light whose wavelengths are relatively long among the green light. This will affect light sensitivity for purer green light. The light sensitivity for the pure green light serving as the ambient light is higher if the mixing ratio of $Si_xGe_y$ in the photoreceptor is X:Y=1: (0.5~0.7).

In addition, X and Y in $Si_xGe_y$ may also satisfy the following formula: X:Y=(0.1~0.3):1. In this solution, a germanium material that absorbs red light easily serves as a main material. This solution is intended for a circumstance in which the ambient light is red light, and can absorb purer red light, react quickly, and increase the sensitivity of the photoreceptor. If the molar weight of silicon exceeds 0.3, the photoreceptor will tend to absorb the red light whose wavelengths are relatively short among the red light. Because the absorbed red light is not pure, the light sensitivity of the photoreceptor decreases. On the other hand, if the molar weight of silicon is less than 0.1, all the absorbed red light may be the red light whose wavelengths are relatively long among the red light, and may exceed a photosensitive range of the photoreceptor.

Figure 4:
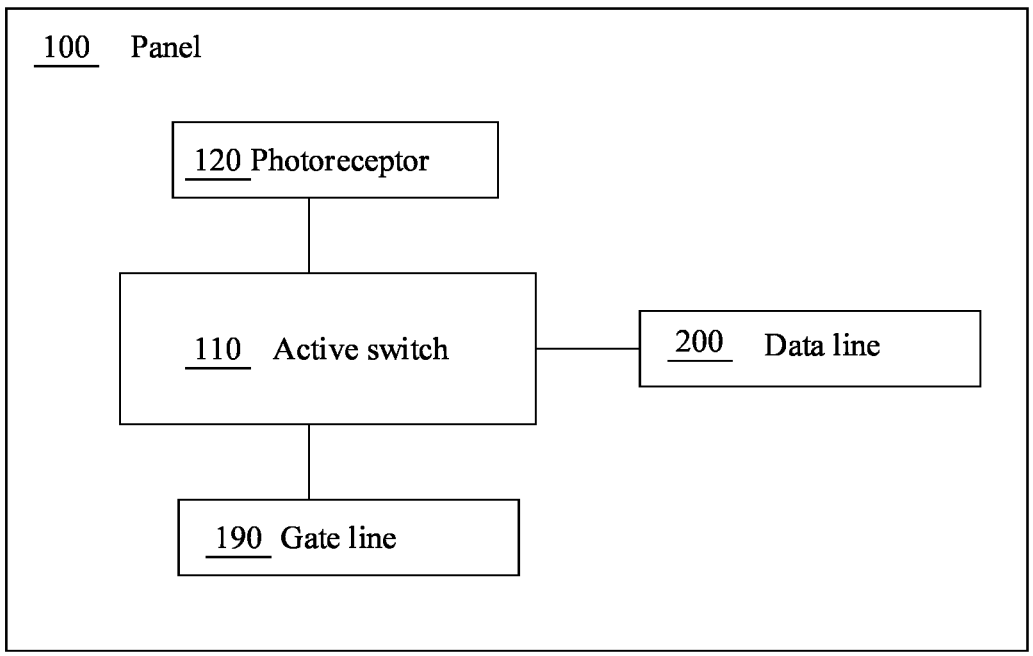
FIG. 4 is a schematic diagram of a panel according to another embodiment of this application.

As shown in FIG. 4, in one or more embodiments of this application, a panel 100 is disclosed, including: a plurality of the photoreceptors 120; a plurality of active switches 110; a plurality of gate lines 190; and a plurality of data lines 200. An input terminal of the active switch 110 is connected to an output terminal of the photoreceptor 120. A control terminal of the active switch 110 is connected to a corresponding gate line 190 of the panel 100. An output terminal of the active switch 110 is connected to a corresponding data line 200. When the control terminal of the active switch 110 is turned on, the output terminal of the active switch 110 outputs an induced voltage of the photoreceptor 120 to the data line 200 of the panel 100.

In this solution, the photoreceptor is applied in the panel 100. The panel 100 may be a fingerprint panel, a palmprint panel, a TFT-LCD (thin film transistor-liquid crystal display) display, or an OLED (Organic Light-Emitting Diode) display. The input terminal (D) of the active switch 110 is connected to the output terminal of the photoreceptor 120. When receiving light induction, the photoreceptor 120 generates an induced voltage. The control terminal of the active switch 110 is connected to a corresponding gate line 190 of the panel 100. The output terminal (S) of the active switch 110 is connected to a corresponding data line 200. When the control terminal (G) of the active switch 110 is turned on, the output terminal of the active switch 110 outputs the induced voltage of the photoreceptor 120 to the data line 200 of the panel 100, so that quick reaction can be implemented. The active switch 110 is generally a thin film transistor (Thin Film Transistor, TFT), but may also be another circuit or element that serves an equivalent function.

In one or more embodiments, the photoreceptor 120 is disposed on a side of the active switch 110, the side being close to the light to be sensed. In this solution, the photoreceptor 120 is above the active switch 110, and is on the side close to the light to be sensed, so as to be closer to a side of the panel 100, the side receiving incident light from outside. Therefore, the received light is stronger, and the sensitivity of the photoreceptor 120 is higher.

Figure 5:
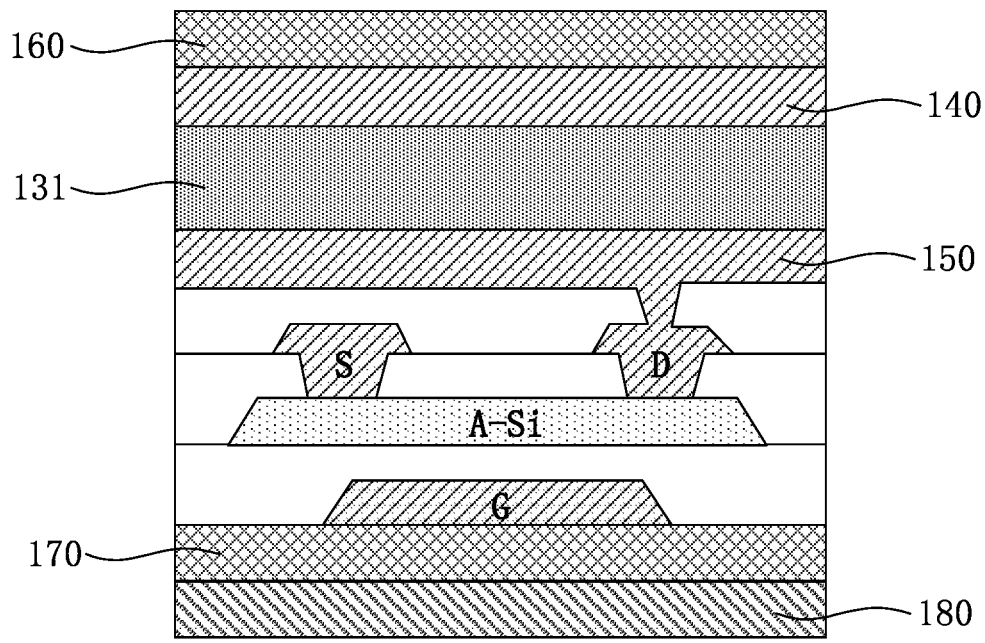
FIG. 5 is a schematic diagram of connection between a photoreceptor and an active switch according to another embodiment of this application.

In one or more embodiments, as shown in FIG. 5, the photoreceptor 120 overlaps, and is vertically connected in series to, the active switch 110. The photoreceptor 120 is disposed directly above the active switch 110, and overlaps and is vertically connected in series to the active switch 110 in a direction of the light incident on a surface of the panel 100. In contrast with a solution in which the photoreceptor 120 and the active switch 110 are disposed horizontally, the photoreceptor 120 and the active switch 110 occupy a smaller space, there increasing an exposure ratio of the panel 100.

In one or more embodiments, as shown in FIG. 5, the photoreceptor 120 includes a first encapsulation layer 160 disposed on a side of the photoreceptor 120, the side being close to an incident direction of external light, and a second encapsulation layer 170 disposed on a side of the active switch 110, the side being away from the incident direction of the external light. The first electrode 140 is disposed between the photosensitive layer 130 and the first encapsulation layer 160. The second electrode 150 is disposed between the photosensitive layer 130 and the active switch 110. The first electrode 140 is a transparent electrode, and the second electrode 150 is a transparent electrode (such as indium tin oxide). Alternatively, the second electrode may be a non-transparent electrode such as a metal material. In this solution, to prevent the first electrode 140 and the second electrode 150 from being corroded by an external environment, an encapsulation layer is provided to serve a protection function. The first electrode is a transparent electrode, and the second electrode is a non-transparent electrode. With the first electrode being a transparent electrode, reaction to the incident light from the outside is not affected. With the second electrode being a metal layer, resistivity is reduced, and sensing of the external light is not affected.

In one or more embodiments, a flexible substrate 180 is disposed at an end of the second encapsulation layer 170, the end being away from the thin film transistor. The flexible substrate 180 may be a semi-crystalline thermoplastic polymer such as polyester (PET) and polyethylene naphthalate (PEN). Serving as the flexible substrate in the flexible substrate, PET and PEN exhibit some important characteristics, including inherent high transparency, simple processing, good mechanical performance, and high performance of resisting permeation of oxygen and water vapor. The flexible substrate may also be an amorphous polymer with a high glass transition temperature (Tg) (such as PI). Such material is of high thermal stability and good mechanical and chemical performance, but is of low transparency and relatively expensive. In this solution, the flexible substrate 180 is characterized by resistance to a high temperature. Generally, the light is relatively strong and the temperature is relatively high in a place close to a backlight source. Therefore, the flexible substrate 180 is provided to protect the entire encapsulation layer and devices such as the active switch 110.

The active switch is generally a thin film transistor (Thin Film Transistor, TFT). In addition, the TFT is generally manufactured by using a 4-mask (photomask) technology, and the photoreceptor is generally manufactured by using the foregoing steps and methods. The TFT and the photoreceptor may be disposed on an identical layer, but may also be disposed on different layers, depending on requirements in different working environments. In addition, during the foregoing manufacturing process of the panel, the TFT may be formed first, or the photoreceptor may be formed first before the TFT. The specific process may be adjusted appropriately with reference to the steps of the manufacturing process, so as to achieve an optimal effect.

Figure 6:
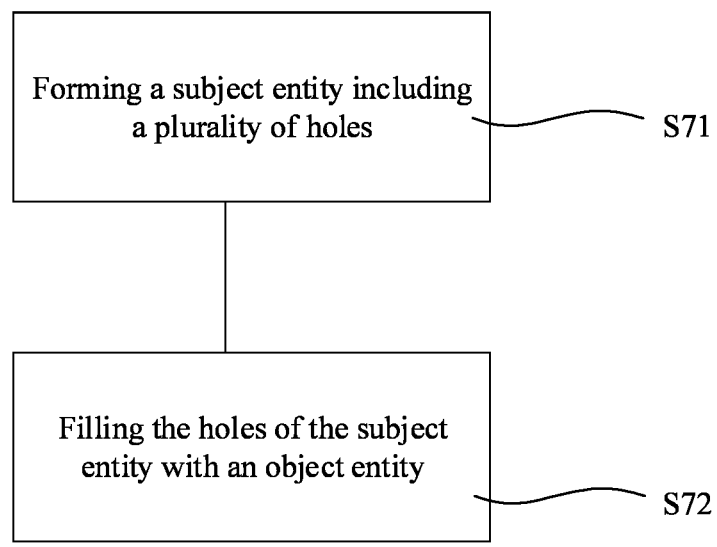
FIG. 6 is a schematic diagram of formation of a photosensitive layer according to an embodiment of this application.

As shown in FIG. 6, another embodiment of this application discloses a method for manufacturing a photoreceptor 120, including the following steps:

S71: forming a subject entity including a plurality of holes; and

S72: filling the holes of the subject entity with an object entity;

where the object entity 132 includes at least two photosensitive materials 1321 whose photosensitive wavelength bands are different.

The subject entity 131 is mainly made of mesoporous silica. The silica is of high stability, and does not absorb light. This prevents the subject entity 131 from absorbing light, and therefore, the object entity 132 is not precluded from absorbing stronger light, and the sensitivity of the photoreceptor 120 is not thereby reduced. In addition, after the object entity 132 is formed from at least two different photosensitive materials 1321, the holes 1311 of the subject entity 131 may be filled with the object entity by primarily using a molecular assembly technology. In this way, the holes 1311 are arranged more regularly, and the holes 1311 are uniform in size and absorb light evenly, and the sensing of light is more precise.

In one or more embodiments, the step of filling the holes 1311 of the subject entity 131 with the object entity 132 includes: selecting silane ($SiH_4$) and germane ($GeH_4$); and preparing a silicon-containing photosensitive material 1321 and a germanium-containing photosensitive material 1321 by using a high-density plasma chemical vapor deposition (HDP-CVD) technology. In this solution, $SiH_4$ and $GeH_4$ are used in the high-density plasma chemical vapor deposition technology. The subject entity including a plurality of holes can be directly filled to form a nano-sized silicon-containing photosensitive material and a nano-sized germanium-containing photosensitive material. The arrangement is compact and regular, stability is enhanced, and light waves are absorbed more efficiently.

Figure 7:
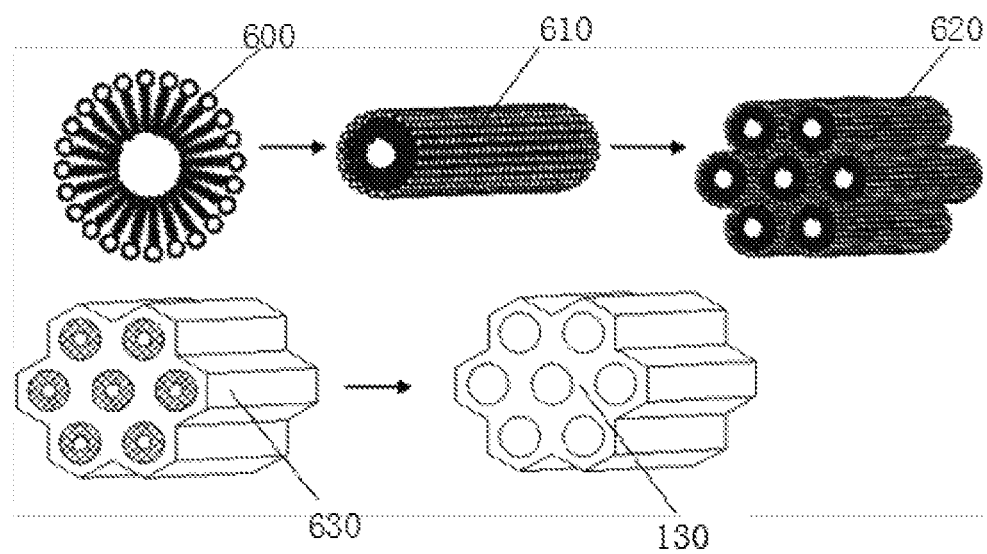
FIG. 7 is a schematic diagram of a manufacturing method according to an embodiment of this application.
Figure 8:
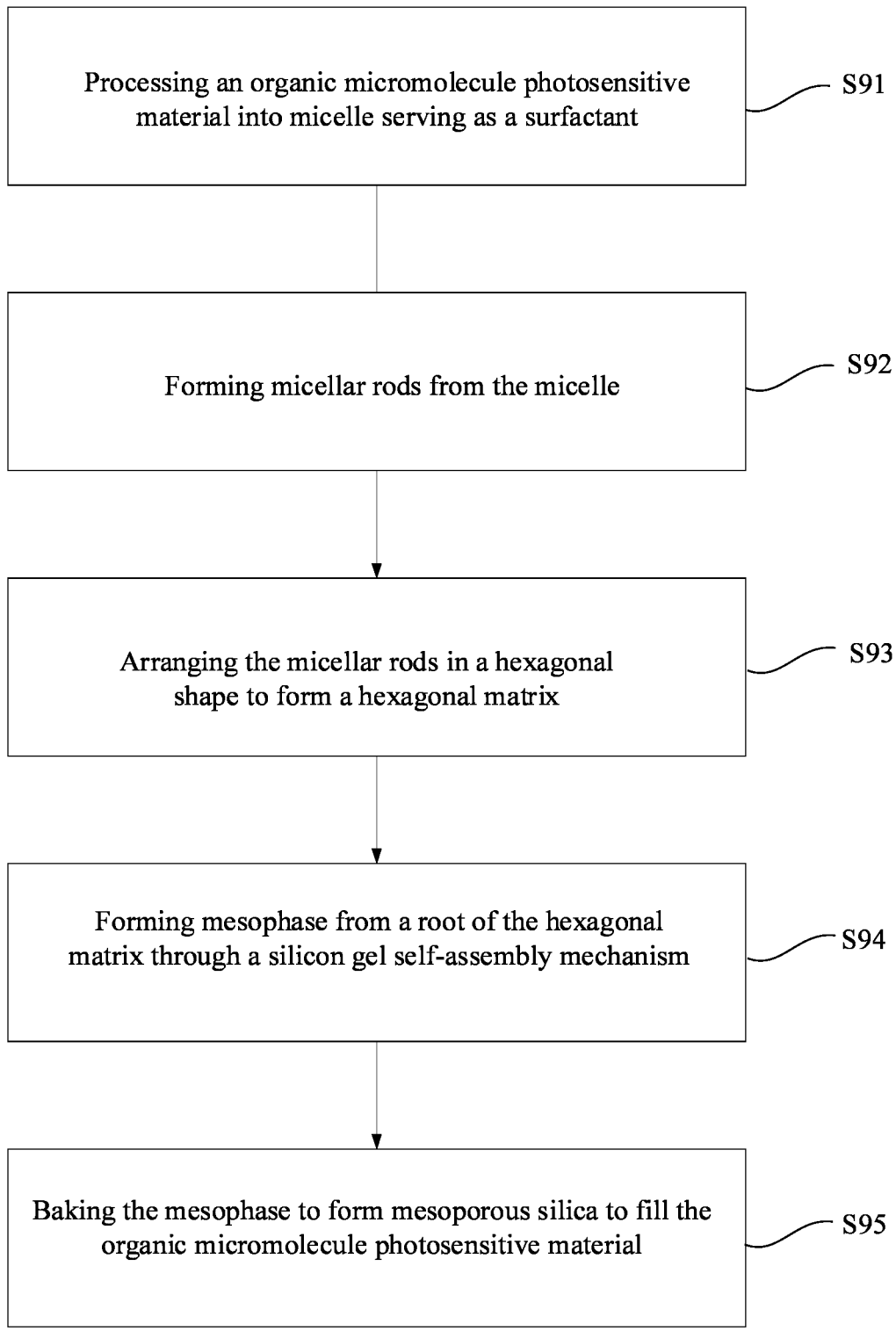
FIG. 8 is a schematic diagram of a manufacturing method according to another embodiment of this application.

As shown in FIG. 7 and FIG. 8, in one or more embodiments of this application, a method for manufacturing a photoreceptor 120 is disclosed. The manufacturing method includes the following steps:

S91: processing a photosensitive material 1321 into micelle serving as a surfactant 600;

S92: forming micellar rods 610 from the micelle 600;

S93: arranging the micellar rods 610 in a hexagonal shape to form a hexagonal matrix 620;

S94: forming mesophase 630 from a root of the hexagonal matrix 620 through a silicon gel self-assembly mechanism; and S95: baking the mesophase 630 to form mesoporous silica to fill the photosensitive material, so as to form a photosensitive layer 130.

It needs to be noted that, to the extent that the implementation of the specific solution is not affected, no limitation on a step in this solution is considered to be a limitation on the order of steps. A step written before another step may be performed before or after the other step, or even performed simultaneously. All variations capable of implementing this solution fall within the protection scope of this application.

The technical solution of this application is widely applicable to various display panels, for example, a twisted nematic (twisted nematic, TN) display panel, an in-plane switching (in-plane switching, IPS) display panel, a vertical alignment (vertical alignment, VA) display panel, and a multi-domain vertical alignment (multi-domain vertical alignment, MVA) display panel, and may also be applicable to other types of display panels such as an organic light-emitting diode (organic light-emitting diode, OLED) display panel.

The foregoing content is a detailed description of this application made with reference with specific optional embodiments, but the specific implementation of this application is not limited to such description. Simple derivations or replacements may be made by a person of ordinary skill in the art of this application without departing from the conception of this application, and all such derivations and replacements fall within the protection scope of this application.

What is claimed is:

1. A photoreceptor, wherein the photoreceptor comprises a photosensitive layer, and the photosensitive layer comprises:
   a subject entity, comprising a plurality of holes; and
   an object entity, comprising at least two photosensitive materials whose photosensitive wavelength bands are different, wherein the holes of the subject entity are filled with the photosensitive materials;
   wherein the photosensitive materials comprises a silocon-containing photosensitive material and a germanium-containing photosensitive material.

2. The photoreceptor according to claim 1, wherein a molar weight of silicon in the silicon-containing photosensitive material is X, a molar weight of germanium in the germanium-containing photosensitive material is Y, and X and Y satisfy the following formula:

$$X:Y=1:(0.1\sim0.2).$$

3. The photoreceptor according to claim 1, wherein a molar weight of silicon in the silicon-containing photosensitive material is X, a molar weight of germanium in the germanium-containing photosensitive material is Y, and X and Y satisfy the following formula:

$$X:Y=1:(0.5\sim0.7).$$

4. The photoreceptor according to claim 1, wherein a molar weight of silicon in the silicon-containing photosensitive material is X, a molar weight of germanium in the germanium-containing photosensitive material is Y, and X and Y satisfy the following formula:

$$X:Y=(0.1\sim0.3):1.$$

5. A panel, comprising:
   a plurality of photoreceptors;
   a plurality of active switches;
   a plurality of gate lines, connected to the plurality of active switches in a one-to-one correspondence; and
   a plurality of data lines, intersecting the plurality of gate lines, wherein
   an input terminal of the active switch is connected to an output terminal of the photoreceptor, a control terminal of the active switch is connected to a corresponding gate line, and an output terminal of the active switch is connected to a corresponding data line;
   the photoreceptor comprises a photosensitive layer, and the photosensitive layer comprises:
   a subject entity, comprising a plurality of holes; and
   an object entity, comprising at least two photosensitive materials whose photosensitive wavelength bands are different, wherein the holes of the subject entity are filled with the photosensitive materials, and wherein the photosensitive materials comprises a silicon-containing photosensitive material and a germanium-containing photosensitive material;
   when the control terminal of the active switch is turned on, the output terminal of the active switch outputs an induced voltage of the photoreceptor to the data line of the panel.

6. The panel according to claim 5, wherein the photoreceptor is disposed on a side of the active switch, the side being close to light to be sensed.

7. The panel according to claim 5, wherein the photoreceptor overlaps the active switch.

8. The panel according to claim 5, wherein the photoreceptor further comprises a first electrode and a second electrode; the first electrode is a transparent electrode, the second electrode is a non-transparent electrode, and the photosensitive layer is disposed between the first electrode and the second electrode.

9. The panel according to claim 5, wherein the photoreceptor further comprises a first electrode and a second electrode; both the first electrode and the second electrode are transparent electrodes, and the photosensitive layer is disposed between the first electrode and the second electrode.

10. The panel according to claim 7, wherein the photoreceptor is disposed on the active switch, and the photoreceptor is vertically connected in series to the active switch in a direction of light incident on a surface of the panel.

11. The panel according to claim 9, wherein the photoreceptor comprises a first encapsulation layer disposed on a side of the photoreceptor, the side being close to an incident direction of external light, and a second encapsulation layer disposed on a side of the active switch, the side being away from the incident direction of the external light; and the first electrode is disposed between the photosensitive layer and the first encapsulation layer, and the second electrode is disposed between the photosensitive layer and the active switch.

12. The panel according to claim 11, wherein a flexible substrate is disposed at one end of the second encapsulation layer, the end being away from the active switch, and the flexible substrate comprises a semi-crystalline thermoplastic polymer.

13. The panel according to claim 6, wherein the active switch comprises a thin film transistor, and the thin film transistor and the photoreceptor are disposed on an identical layer.

14. The panel according to claim 6, wherein the active switch comprises a thin film transistor, and the thin film transistor and the photoreceptor are disposed on different layers.

15. A method for manufacturing a photoreceptor, comprising steps of:
 forming a subject entity comprising a plurality of holes; and
 filling the holes of the subject entity with an object entity; wherein
 the object entity comprises at least two photosensitive materials whose photosensitive wavelength bands are different;
 wherein the step of filling the holes of the subject entity with an object entity comprises:
 selecting silane germane; and
 preparing a silicon-containing photosensitive material and a germanium-containing photosensitive material by using a high-density plasma chemical vapor deposition technology.

16. The method for manufacturing a photoreceptor according to claim 15, wherein a mixing ratio of a silane to a germane is adjustable a molar weight of silicon in the silane is X, a molar weight of germanium in the germane is Y and X:Y=1:(0.1~0.2) or 1:(0.5~0.7) or (0.1~0.3):1.

* * * * *